United States Patent [19]

Blum

[11] Patent Number: 4,621,363
[45] Date of Patent: Nov. 4, 1986

[54] TESTING AND DIAGNOSTIC DEVICE FOR DIGITAL COMPUTERS

[75] Inventor: Arnold Blum, Gechingen, Fed. Rep. of Germany

[73] Assignee: International Business Machines Corporation, Armonk, N.Y.

[21] Appl. No.: 678,750

[22] Filed: Dec. 6, 1984

[30] Foreign Application Priority Data

Dec. 8, 1983 [DE] Fed. Rep. of Germany ..... 83112339

[51] Int. Cl.[4] ......................... G01R 31/28; G06F 11/00
[52] U.S. Cl. .................................... 371/25; 324/73 R; 371/16
[58] Field of Search ............................ 371/25, 16, 15; 324/73 R, 73 AT

[56] References Cited

U.S. PATENT DOCUMENTS

| | | | |
|---|---|---|---|
| 4,298,980 | 11/1981 | Hajdu et al. | 371/25 |
| 4,476,431 | 10/1984 | Blum | 324/73 R |
| 4,477,902 | 10/1984 | Puri et al. | 371/25 |
| 4,567,593 | 1/1986 | Bashaw | 371/25 |

*Primary Examiner*—Charles E. Atkinson
*Attorney, Agent, or Firm*—John H. Bouchard; Saul S. Seinberg

[57] ABSTRACT

The detailed testing of processors, manufactured according to very large scale integration principles, which also extends to secondary functions of operations, such as the setting or non-setting of particular state indicators, necessitates the transfer of large quantities of test data between the processor and the tester, for which purpose no distinction is drawn between external and integrated testers. For testing such structures, the known LSSD method is frequently used wherein the storage elements of the logic subsystems are combined in the form of shift register chains for testing. To permit a fast exchange of test data on the system bus, connecting the processor to a tester, interface register stages are also included in the shift register chain which has a garland-shaped structure and whose beginning and end are connected by a controllable switch during testing. During testing, the entry of test data and the emission of result data, which are in each case effected through the system bus and the shift steps of the garland-shaped shift register chain, overlap one another.

9 Claims, 8 Drawing Figures

TESTING AND DIAGNOSTIC DEVICE FOR DIGITAL COMPUTERS

BACKGROUND OF THE INVENTION

1. Technical Field of the Invention

The invention concerns an error testing and diagnostic device for an electronic data processing system comprising at least one processor, one main storage and one maintenance and service processor interconnected by a fast system bus.

2. Description of Related Art

The testing of very large scale integrated logic and storage circuits on chips, of which electronic controls, processors and other data processing systems consist, is based to a considerable degree on the accessibility (observability, controllability) of the totality of the storage elements (bistable circuits, flip-flops) on the chip. It is here where problems are encountered, because digital systems require an extremely high error coverage, and the testing of very large scale integrated circuit structures is time-consuming and expensive owing to the circuit density of such VLSI chips (VLSI=Very Large Scale Integration). The processing units, such as the microprocessors, consist of or comprise highly complicated chips which have to be tested such that the large number of states bistable storage elements are capable of assuming and the even larger number of state sequences these processor storage elements are capable of assuming during the execution of program routines are duly taken into account.

Looking upon a micro instruction as a finite functional entity, then the testing of the generally well specified and well defined micro instruction functions, such as the setting of the state storage locations of an arithmetic and logical unit (ALU), becomes an easily assessable problem after the execution of an add micro instruction. Difficulties are encountered, however, if all possible secondary functions of that add micro instruction have to be tested as well, such as whether the state of a bistable storage element, indicating bus requests during the execution of such an add micro instruction, has changed or not.

The secondary functions generally require a large number of storage elements which are associated with the data flow and the control logic of the processor. Generally, even when special micro instructions are used, these storage elements are not directly accessible for test purposes, without changing the current states of all storage elements serving as state indicators.

Testable, very large scale integrated logic structures and system architecture frequently use what is known as LSSD (Level Sensitive Scan Design) rules, according to which, for example, a logic subsystem is signal level sensitive if, and only if, the response to an input signal change in the steady state is independent of circuit and line delays in that logic subsystem (cf. "A Logic Design Structure for LSI Testability" by E. B. Eichelberger—*Proceedings of the Design Automation Conference*, No. 14, 20 to 22 June 1977, New Orleans, Louisiana, pp. 462 to 468).

Based on those LSSD rules, the totality of the storage elements are made observable and controllable in that the master/slave flip-flops, which are logic components and which are also positioned between the logic stages, are interconnected in the test mode to form one shift register chain or several such chains. These chains are used to shift test and result patterns into and out of the very logic, respectively.

The shift register chains may also be used to shift complete flip-flop or register status data into or out of complex logic groups, such as chips or modules, which are separated from each other with regard to their packaging. This shift register approach has the advantage that only relatively few input/output terminals are required and that there is a high degree of flexibility between the various packaging levels if all first packaging level shift register chains are connected to a common second packaging level shift register chain, etc., without affecting the chip logic.

As the storage elements of a processor consist almost exclusively of shift register stages, the secondary functions can be tested either by an integrated maintenance and service processor or by a connectable separate tester, in that, before or after execution of the micro instruction to be tested, the centers of the bistable storage elements, interconnected for shift register testing, are shifted into the maintenance or service processor or the tester where the state differences are compared with given desired values.

A further significant improvement of the diagnostic capabilities of micro instruction tests for the exchange of data and instructions in processing units and between processors is conceivable by applying the test routines to even smaller functional entities, such as the clocking steps of the micro instruction to be tested. Such an approach would lead to a considerably improved error coverage of automatic tests.

The aforementioned test methods necessitate, however, a high-speed transfer of states stored in a multitude of bistable circuit elements. This transfer would have to be effected by a maintenance and service processor or a factory tester which owing to the known slow test network and the serial shift mechanism are unsuitable for that purpose. Apart from this, the clocking speed of the shift mechanism cannot be increased further despite the very fast technology of processor chips, as the shift ring comprises two slower networks, one extending from the processor or the processing unit to the maintenance and service processor and the other from the maintenance and service processor to the processor (cf. FIG. 1, lines 14 and 13).

Generally, however, data processing systems are provided with parallel high-speed system buses interconnecting the different units, such as the processors 9, 10, ... n, the main storage 3, the main storage control 4, the input/output device control 5, and the maintenance and service processor 6, as shown in FIG. 1. In known data processing systems, however, these system buses are not provided for the maintenance and service processor to have direct access to the bistable elements of the processor containing, among other data, the status information.

One exception is the testing and diagnostic device for digital computers described in the European patent application No. 83 105 172.7. In the case of the data processing system covered by that application, the storage elements (flip-flops) interconnecting the logic subsystems during normal operation are linked for error testing and diagnosis in the form of an addressable matrix, so that the maintenance and service processor provided for is capable of transferring on the fast system bus address information for controlling the individual storage elements of the matrix and test data for entry into the storage elements of the matrix, as well as test control and clock information which is fed to the unit to be tested. Furthermore, after the logic subsystems have been tested, their result data are entered into the connected storage elements and, using the system bus and the address and control information transferred thereon, are subsequently fed from the storage elements, interconnected in the form of a matrix, to the maintenance and service processor.

As the storage elements of the matrix are exclusively made up of so-called master flip-flops, they cannot be realized as usual by means of shift registers consisting of master/slave flip-flops, which is very disadvantageous with many design concepts of data processing systems.

A further disadvantage of known systems is that the test bus 13, 14 has only one core which may lead to line interruptions or total failure of the test bus and thus also of the data processing system, because the maintenance and service processor, by controlling, for example, the system console along with the screen and the keyboard, generally performs, in addition to the test function, the operating function of the system.

Thus, it is a principal object of the present invention to provide a testable logic structure which is extremely fast, reliable and inexpensive, even in the test mode performed on the LSSD principle. It is another object of the present invention to provide testing apparatus wherein the test patterns and result data, which in the test mode are transferred on the very fast system bus between a maintenance processor or tester and the logic structures to be tested, are very rapidly shifted into and out of the shift chains, with the test mode being implemented via the respective bus that is still intact, irrespective of a system bus or test bus failure.

These and other objects of the present invention are achieved through the use of an error testing and diagnostic device for an electronic data processing system having at least one processor, one main storage and one maintenance and service processor interconnected by a fast system bus. For testing such structures, the known LSSD method is frequently used, wherein the storage elements of the logic subsystems are combined in the form of shift register chains for testing. To permit a fast exchange of test data on the system bus, connecting the processor to a tester, the interface register stages are also included in the shift register chain which has a garland-shaped structure and whose beginning and end are connected by a controllable switch during testing. During testing, the entry of test data and the emission of result data, which are in each case effected through the system bus, and the shift steps of the garland-shaped shift register chain overlap one another.

BRIEF DESCRIPTION OF THE DRAWINGS

Further objects and advantages of the present invention will be apparent from the following description taken together with reference to the accompanying drawings in which.

DETAILED DESCRIPTION OF THE PREFERRED EMBODIMENTS OF THE INVENTION

Figure 1:
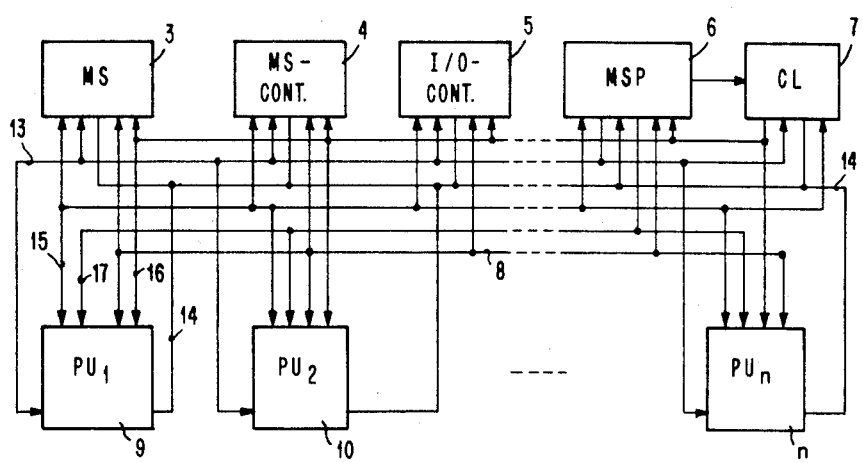
FIG. 1 depicts a functional block diagram of a digital electronic computing system wherein the present invention is used.

FIG. 1 shows the functional block diagram of a modular data processing system comprising single-chip processing units or processors (PU1 to PUn) 9 to n which are connected through a standardized system bus 8 to each other and to a main storage (MS) 3, a main storage control unit (MS-CONT) 4, an input/output device control (I/O-CONT) 5, and a maintenance and service processor (MSP) 6. Also provided are connections 13 to 17 between the above-mentioned system components on the one hand and the maintenance and service processor 6 on the other, by which control and clock signals as well as the test data are transferred. The lines mentioned include a clock line 15 linking the system components to a clock generator (CL) 7 which, as shown in FIG. 1, is also connected to the maintenance and service processor 6. In lieu of a central clock generator, such as clock generator 7, the system components, in particular processors 9 to n, may be provided with individual clock generators on their respective chips.

Figure 5:
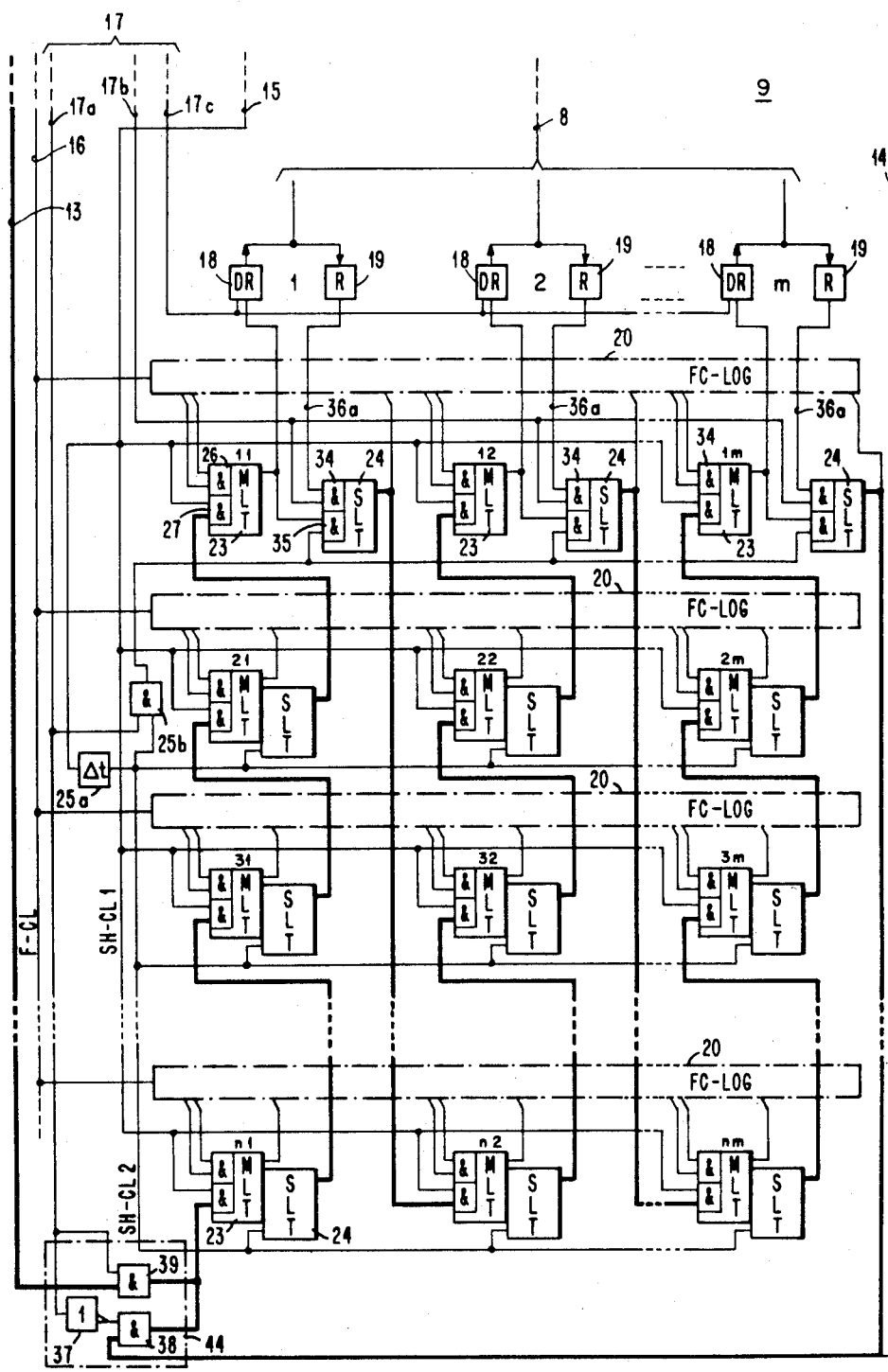
FIG. 5 represents the block diagram of a processing unit having modified circuit arrangements for the test data exchange in accordance with the present invention.
Figure 7:
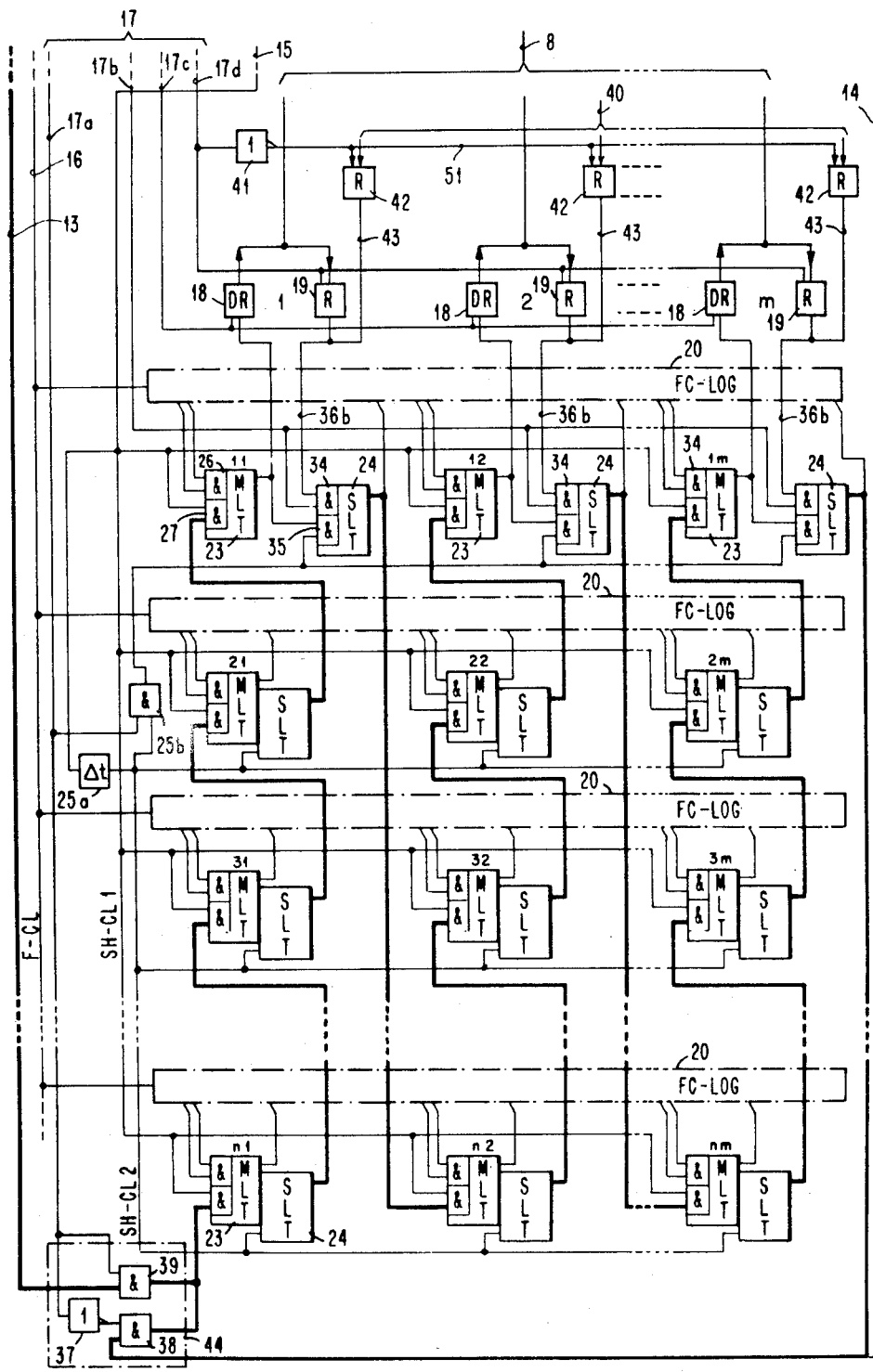
FIG. 7 depicts a block diagram of a further modification of the circuit arrangements for the test data exchange in a processing unit.

The present invention will be described below with reference to a processor 9 designed according to VLSI principles. For purposes of describing the present embodiment, the system bus 8, which may be, for example, a standardized bus, is assumed to have a width of 4 bytes, to which both the bus driver (DR) 18 and the bus receiver circuits (R) 19 are adapted (FIGS. 2, 5 and 7).

The storage elements 23, 24, mostly so-called polarity hold flip-flops, are designed as master/slave flip-flops according to the above-mentioned LSSD rules. In the test mode, these flip-flops are interconnected to form shift register chains.

Figure 2:
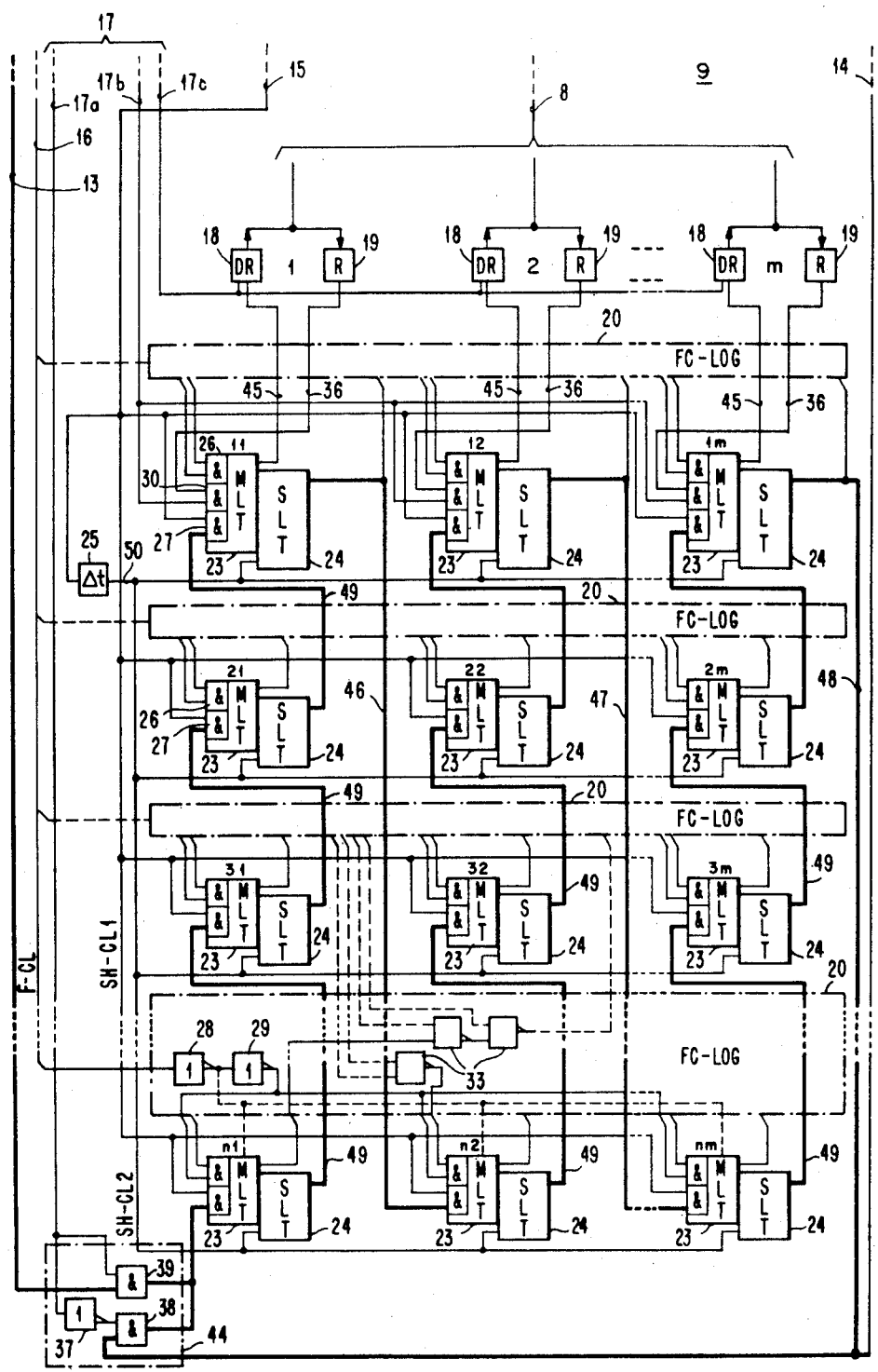
FIG. 2 illustrates a block diagram of a processing unit including the circuit arrangements provided for a test data exchange with a central tester.

FIG. 2, bottom left at position n1, shows the input stage of a shift register chain which is connected to the maintenance and service processor 6 through a switch 44, consisting of inverter 37, two AND gates 38 and 39, and through test bus line 13. The chain continues with shift register stages in the order of the positions 31, 21, 11, n2, 32, 22, 12, ..., nm, 3m, 2m and 1m, the output of the slave flip-flop (SLT) at position 1m being connected to the maintenance and service processor 6 through line 14 of the test bus and to the master flip-flop (MLT) of the input stage n1 through switch 44. In this manner, a connection is established between the maintenance and service processor 6 and the processing unit to be tested, say, processor 9.

The previously mentioned switch 44 serves to connect the output of the shift register chain to its input, so that in the shift register chain itself, the information contents of the shift register stages are capable of circulating in steps from one stage to another. In known data processing systems, the test data or test patterns are serially shifted into the shift register chain through line 13 in response to a shift clock signal applied to the processing unit to be tested by a test shift clock signal line 15 from the maintenance and service processor 6. This shift clock signal, designated as SH-CL1 in the drawings, which corresponds to a shift register stage clock signal applied earlier in time and which controls the transfer of the data to the master flip-flop 23, is delayed on the chip by a delay means 25 for a time Wt. The delayed clock signal, designated as SH-CL2, corresponds to the second shift clock signal of a shift register stage, which signal controls the data transfer from the preceding master flip-flop to the slave flip-flop (SLT).

The test data are generally shifted into the shift register chain through line 13. After receipt of the test data in the individual shift register stages, these data are fed to the logic subsystems 20 to be tested. The logic subsystems 20 are generally made up of different types of logic stages 33, such as NAND, NOR, INVERTER, EXCLUSIVE-OR, and the like. In the logic subsystems, the test data are processed in response to function clock signals F-CL which are either directly transferred to the processor 9 on line 16 from the central clock generator 7 or which are alternatively generated by a clock generator associated with the processor.

The response of the logic subsystems 20 to the test data, i.e., the result data, is subsequently received by the shift register stages and shifted on line 14 together with the shift clocks SH-CL1 and SH-CL2 into the maintenance and service processor 6 for error analysis and/or diagnosis. As this serial transfer process is too slow for the large quantities of data required for testing data processing systems down to their very logic structure, the fast bit-parallel system bus 8 is used as a transfer means. This, however, gives rise to the problem of the test data from the interface registers of the system bus being entered into the shift register stages in the direction of receipt of the processor to be tested at the same speed at which the result data, stored in the shift register stages, are fed to the interface registers between the system bus 8 and the logic of the processor 9 in the direction of transmission.

If the shift register chains are arranged such that a garland-shaped structure is obtained, which also includes the interface register stages, then an access parallelization, as required by the parallel system bus 8, is possible in the test and diagnostic mode. Input and output of the garland-shaped shift register chain are connected in the form of a ring by switch 44. This ring consists of the connecting lines 49 linking the individual stages of a partial garland element consisting of the shift register stages at positions n1, 31, 21 and 11 and of the connecting lines 46, 47 and 48 linking the remaining partial elements of the chain.

The above-mentioned stages of the interface register are identical with the shift register stages at positions 11, 12, . . . , 1m. The fast entry of data from the maintenance and service processor or a factory tester, connected to the system bus 8 and the control lines 15 to 17, is effected through the bus receiver circuits 19, the connecting lines 36 and the input gates 30 of the respective master flip-flop 23 of the interface register stages. A control signal on the control line 17a switches switch 44 to the test mode in which the garland-shaped shift register chain is connected in the form of a ring.

In addition, a pulse of the shift clock SH-CL1 is applied through line 15 and transferred to all master flip-flops 23 of the shift register chain. This shift pulse is also transferred to the delay means 25 which generates a pulse of the shift clock SH-CL2, which is applied to all slave flip-flops 24 of the shift register chain. Also required is a control pulse on control line 17b, which switches the previously mentioned input gates 30 of the master flip-flops 23 of the interface register stages such that the data are entered into the system bus at the appropriate time.

That completes a first shift step, so that in the subsequent shift step fresh data may be entered through the master flip-flop 23 of the interface register. The data of the preceding transfer step are then fed on connecting lines 46, 47 and 48 from the slave flip-flops 24 to the master flip-flops of the subsequent shift register stages at positions n1, n2, . . . nm. In that manner, data can be fed to the shift register chain much more rapidly than would be possible in a purely serial mode. In addition, much faster shift clocks may be generated on the VLSI chip by a single high-frequency pulse train than that fed from the maintenance and service processor 6 to the processor chip. This also avoids the usual clock skews that would limit the pulse frequency of the shift clocks SH-CL1 and SH-CL2, without permitting these clocks to overlap or without affording sufficient time for the worst case of signal propagation time between two adjacent shift register stages along the shift register chain. As the entire shift register chain is located on a single VLSI chip rather than on several such chips, the pulse frequency of the shift clocks may also be chosen much higher. In view of the garland-shaped structure of the shift register chain and the fact that the stages of the interface register are included in the shift register chain, and furthermore in view of the stepwise generation of the pulses of shift clocks SH-CL1 and SH-CL2, which are both generated in response to a single external clock pulse applied by the processor chip 9, all interface register stages may be loaded with fresh information.

Figure 3:
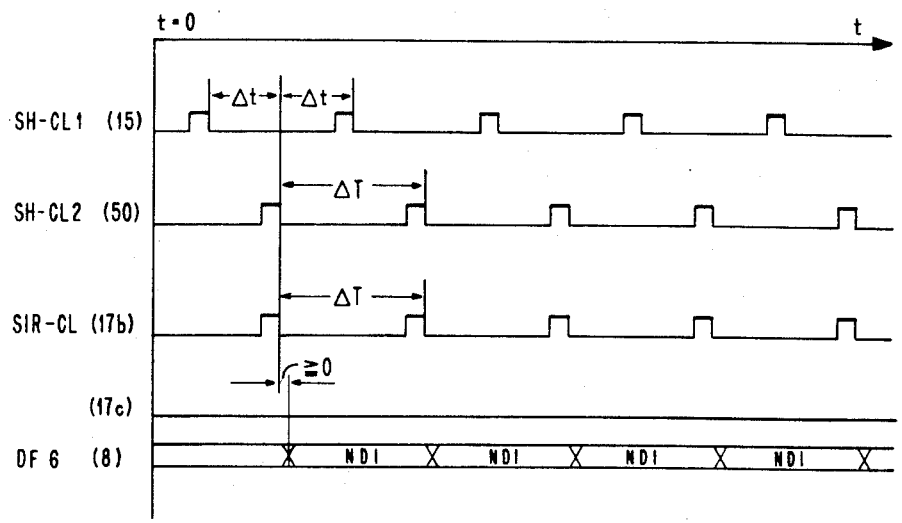
FIGS. 3 and 4 show time diagrams explaining the test data exchange.

The time processes involved are shown in greater detail in FIG. 3. The second line in FIG. 3 shows the clock pulse train SH-CL1 transferred on line 15 from the maintenance and service processor 6 or the tester. In this case, shift clock SH-CL2, produced by the delay means 25, appears with a delay Wt on line 50. Assuming that the maximum delay Wt of a clock system extending beyond the processor chip boundaries is twice as high as the maximum delay Wt of the clock confined to the processor chip, then the test and result data may be shifted, utilizing several possibilities of shift clock generation. A single external clock pulse generates the shift clocks SH-CL1 and SH-CL2 on the chip. Subsequently, a clock SIR-CL, transferred on control line 17b from the maintenance and service processor 6 or a connected tester to processor 9, controls the input stage 30 of the master flip-flops of the interface register stages such that the test data reach the interface registers through the lines of the system bus 8. This process is illustrated in the last line of FIG. 3, according to which the respective subsequent test data NDI are entered into the interface registers in direct response to a pulse of clock SIR-CL. The designation DF 6 (Data From 6) of this last line in FIG. 3 is to indicate that the maintenance and service processor 6 is the source of those data. The control line 17c may remain inactive during the transfer of result data from processor 9 through system 8, since the bus transmitter circuits are not required (cf. FIG. 3, penultimate line).

As shown in FIG. 3, the data transfer operations through system bus 8 from the maintenance and service processor overlap the internal shift steps. Thus, for a 32-bit wide system bus, the time necessary for accessing a shift register stage is 64 times shorter than the time that would be required for accessing a conventional shift register stage operated to LSSD design rules.

The result data, which after each test step are available in the shift register stages to be transferred to the maintenance and service processor 6 for error testing and/or diagnosis, are analogously transferred through lines 45, the bus transmitter circuits 18 and the system bus 8 from the output of the master flip-flop 23 of the interface register to the maintenance and service processor 6. The respective transmission time is determined by a signal on the control line 17c, which may be generated, for example, by the maintenance and service processor, activating the bus transmitter circuits 18. Prior to that step, however, the result data of the logic subsystems 20 reaches the master flip-flops 23 through the input stages 26. For the remaining shift register stages, i.e. the stages other than those associated with the interface register, the result data of the logic subsystems are transferred from the master flip-flop 23, for example, the shift register stage at position 21, to the associated slave flip-flop 24 and through line 49 to input 27 of the respective subsequent shift register stage until they finally reach a stage of the interface register from where they travel along the previously described route to the maintenance and service processor.

Figure 4:
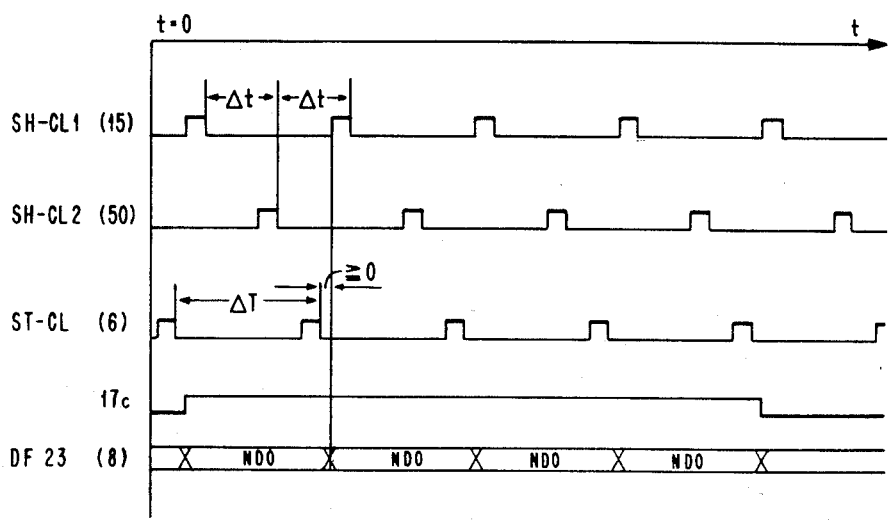

The time diagram in FIG. 4 is very similar to that in FIG. 3, although in lieu of the control clock SIR-CL in the maintenance and service processor 6 or a connected tester, the control clock ST-CL is generated which in the tester controls the entry of the respective subsequent (result) data, referred to as NDO in the bottom-most line from the top in FIG. 4. According to the bottom-most line in FIG. 4, these result data are derived from the m master flip-flop 23 of the interface register and are transferred on system bus 8. The signal in FIG. 4, second line from the bottom, which is transferred through the control line 17c, controls the bus transmitter circuits 18 such that the presence of this signal causes the result data to be transferred through the lines of the system bus 8.

The tester illustrated in FIG. 5, which is associated with the processor 9, shows how by introducing an additional input stage 34 at the slave flip-flops 24 of the interface register stages and by linking that input stage to the bus receiver circuits 19 by receiving lines 36a, an alternating mode for the transfer of the test and result data affords a 32 times higher speed than a conventional test and result data transfer with the aid of LSSD shift chains.

Figure 6:
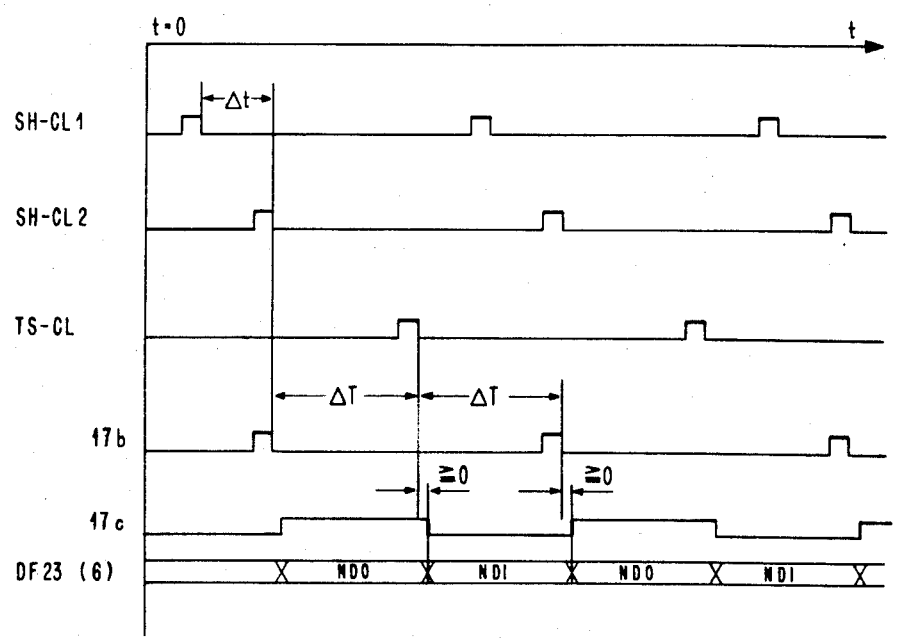
FIG. 6 shows a time diagram explaining the test data exchange in conjunction with a processing unit according to FIG. 5.

FIG. 6 shows the relevant time diagram for that alternating mode. Compared with FIGS. 3 and 4, it will be seen that the frequency of shift clocks SH-CL1 and SH-CL2 is reduced by fifty per cent. This is due to the fact that the data transfer speed through the bidirectional system bus 8 is constant and that the system bus 8 is shared by the test and result data.

Compared with a data transfer that is effected only in the direction of transmission from the processor chip 9 to the maintenance and service processor 6, the control signal on control line 17c, which activates the bus transmitter circuits 18, has an alternating pattern (cf. second line from the bottom). This alternating pattern also reflects the clock conditions on the control line 17b, since the pulses of this clock are used to control the entry of test data through the input stage 34 of the slave flip-flop 24 of the interface register stages. For this purpose it is necessary, however, that the shift clock SH-CL2 for the slave flip-flops of the interface register stages be switched off. This is done with the aid of a gate circuit 25b which, in the ring-shaped garland test mode, is latched by a control signal, e.g. binary zero, on the control line 17a, so that the shift pulses SH-CL2, generated by the delay means 25a, are no longer passed on. The entry of the result data, contained in the maintenance and service processor 6, into the input register (not shown) of this processor is effected in response to a clock TS-CL.

The time diagrams of FIGS. 3, 4, 6 and 8 show how the shift register stages of the processor 9 continue to be clocked by shift clocks SH-CL1 and SH-CL2. In the direction of transmission, i.e. upon transfer of the result data, the propagation time of the data on the system bus has to be taken into account for the transfer clock ST-CL in the maintenance and service processor 6 or in a connected tester. For this purpose, the system bus time is delayed over the shift clock SH-CL2, as is shown in FIGS. 4 and 6. In the direction of receipt, i.e. when test data are transferred, the pulses of the control clock SIR-CL, which are transferred on the control line 17b, may coincide in time with the shift clock SH-CL2.

A further increase in speed by the factor 2 is obtained by using the system bus 8 in the test mode as a unidirectional bus. In the present example, that bus serves to transfer the result data. As, according to FIG. 7, the processor chips 9, 10, ... n are anyhow provided with functional input terminals for factory test purposes, the input bus 40, linking these terminals to the tester, may also be used to establish a connection to the maintenance and service processor 6, by means of which the test data are transferred to the processor chip 9. In this manner, the transfer of test and result data may be made to overlap. For this purpose, the system bus receiver circuits 19 and the input bus receiver circuits 42 are controlled by the signals on control line 17d and control line 51 which reflects the inverted states of the signals on control line 17d, for which the inverter 41 is responsible.

Figure 8:
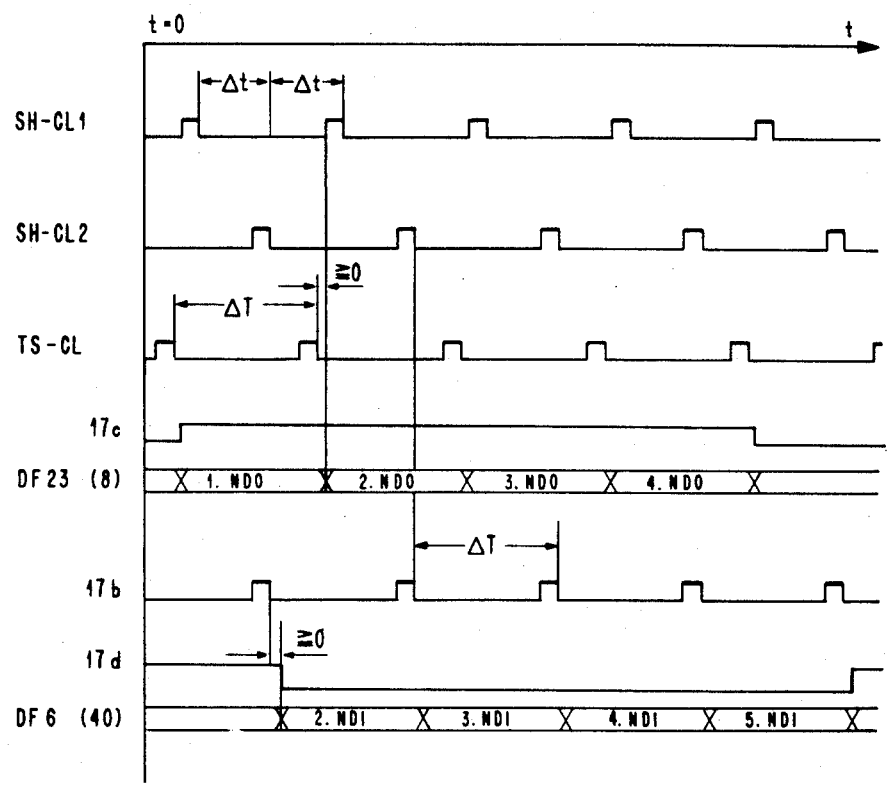
FIG. 8 illustrates a time diagram explaining the data exchange in conjunction with a processing unit according to FIG. 7.

The transfer of the result data is again controlled by signals on the control line 17c, which activate the bus transmitter circuits 18. FIG. 8 is the relevant time diagram showing the overlapped transfer of test data NDI and result data NDO as well as the resultant frequency doubling of the time control signals in rows 1, 2, 3 and 5. In the event of an error of the system bus 8 or the respective bus transmitter and receiver circuits and also in the event of an error of the interface register in the maintenance and service processor 6 or for special test purposes, the test data are entered into the garland-shaped shift register chain through line 13 and switch 44.

By a signal on the control line 17a, the AND gate 39 for transferring the test data is activated in switch 44, and the AND gate 38 is deactivated through inverter 37. Through the AND gate 39 and by means of the shift clock SH-CL1 on control line 15 and the shift clock SH-CL2 generated on the processor chip 9, the test data reaches the shift register chain in steps. After the loading of the chain is completed, the test data from the respective logic subsystems 20 are applied. The logic subsystems 20 respond to the test data by emitting result data which are then fed in steps from the logic subsystems to the shift register chain. From the shift register chain, the result data are serially transferred, with the aid of the shift clock on line 14, to the maintenance and service processor 6 for error analysis and diagnosis.

Thus, it is possible to test the processor logic in the event of errors and, if necessary, to keep the data processing system operating, albeit at greatly reduced speed. The latter approach is used where it is more important to continue operating a system than to have it available at high speeds.

While this invention has been particularly shown and described with reference to the preferred embodiment thereof, it will be understood and appreciated by those having skill in the appertaining art that various changes in form and details may be made therein without departing from the spirit and scope of the invention.

Having thus described my invention, what I claim as new, and desire to secure by Letters Patent is:

1. An error testing and diagnostic device for an electronic data processing system having at least one processor, one main storage and one maintenance and service processor interconnected by a fast system bus, the processing system including logic subsystems and storage elements, said device comprising:
   (a) connection means for interconnecting the storage elements (master/slave flip-flops 23, 24) of the processing system during the error and diagnostic mode thereof in the form of a garland-shaped shift register chain;
   (b) controllable switch means (44) for linking the beginning and end of said garland-shaped shift register chain;
   (c) clock generating means for producing clock signals (SH-CL1 and SH-CL2) to be used in shifting data into and through said shift register chain; and
   (d) interface register means formed by predetermined ones of the storage elements connected between the system bus (8) and the processor logic made up of logic subsystems (20) for use as both a data receiving and transmitting register, and included in said shift register chain, so that test data from the maintenance and service processor (6) is transmitted in parallel on the system bus (8) to said interface register means from where it is entered in steps, through said garland-shaped shift register chain, into the logic subsystems, and that upon completion of testing, the resultant data from the logic subsystems is entered into said shift register chain from where it is transferred in steps to said interface register and from there in parallel to the maintenance and service processor (6) for error analysis and diagnosis.

2. The device according to claim 1, adapted to work in conjunction with an external tester, which device additionally comprises:
   (a) test bus means (13, 14) for connecting the maintenance and service processor (6) and the tester;
   (b) error sensing means, connected to said controllable switch means (44), for generating an error signal in the response to the detection of a system bus error and applying the same to said switch means (44), whereby said switch responsively is set to a position in which the ring connection between the first and the last stage of said garland-shaped shift register stage is interrupted and the test and result data are thereafter transferred to and from the unit under test via said test means.

3. The device according to claim 1 which additionally comprises:
   (a) a plurality of bus receiver circuits (19) connected to said bus (8) for receiving test data therefrom;
   (b) an additional input stage (34) for said interface register means which is made up of slave flip-flops (24), said additional input stage having one of its inputs connected to said bus receiver circuits (19) for receiving test data therefrom;
   (c) a control line (17b), connected between said clock generating means and the other input of said additional input stage (34), for applying said output clock signals thereof (SH-CL2) directly to said other input of said additional input stage;
   (d) delay means, connected to the output of said clock generating means for delaying the clock signal (SH-CL2) produced thereby; and
   (e) latching circuit means (25b) connected between said delay means and said interface register means for latching said clock signals (SH-CL2) so that they cannot be immediately transferred to the slave flip-flops (24) of said interface register means; and
   f) transfer circuit means for controlling the transfer of the result data from the master flip-flops (23) of said interface register means to the system bus (8).

4. The device according to claim 3, adapted to work in conjunction with an external tester, which device additionally comprises:
   (a) test bus means (13, 14) for connecting the maintenance and service processor (6) and the tester;
   (b) error sensing means, connected to said controllable switch means (44), for generating an error signal in the response to the detection of a system bus error and applying the same to said switch means (44), whereby said switch responsively is set to a position in which the ring connection between the first and the last stage of said garland-shaped shift register stage is interrupted and the test and result data are thereafter transferred to and from the unit under test via said test means.

5. The device according to claim 1 adapted for time-overlapped transfer of test and result data, which device further includes:
   (a) additional receiver circuit means (42) for receiving data from said system bus means;
   (b) additional connecting means (43 and 36b) for connecting said additional receiver circuits (42) to the respective input stage (34) of slave flip-flop (24) of said interface register means;
   (c) first and second bus means (8 and 40, FIG. 7), connected as appropriate to all of the system and device elements, for serving as conduits through which the test data is transferred, said bus means being connected to, at least, the maintenance and service processor (6) and the processor (9) and through said additional receiver circuits (42) as well as through connecting lines (43 and 36b) to the respective input stage (34) of the slave flip-flop (24) of the interface register stages; and
   (d) control signal generating means, connected to said additional bus receiver circuits (42) and to said bus receiver circuits (19), for simultaneously applying an activating signal to said additional bus receiver circuits (42) activating the latter and for applying a deactivating signal to said bus receiver circuits (19) deactivating said elements, so that the result data may be fed onto said system bus means to the maintenance and service processor.

6. The device according to claim 5, adapted to work in conjunction with an external tester, which device additionally comprises:

(a) test bus means (13, 14) for connecting the maintenance and service processor (6) and the tester;

(b) error sensing means, connected to said controllable switch means (44), for generating an error signal in the response to the detection of a system bus error and applying the same to said switch means (44), whereby said switch responsively is set to a position in which the ring connection between the first and the last stage of said garland-shaped shift register stage is interrupted and the test and result data are thereafter transferred to and from the unit under test via said test means.

7. A method for operating the device described in claim 1 to facilitate test data entry from the maintenance and service processor (6) through the system bus (8) into the master flip-flops (23) of the interface register stages is effected by the steps of transferring pulses of clock (SIR-CL) from the maintenance and service processor on a control line (17*b*), wherein the test data transfers on the system bus (8) and the internal shift steps (SH-CL1, SH-CL2) are overlapping, and that the result data accrued after each test are transferred from the master flip-flops (23) of the interface register stages through the bus transmitter circuits (18) and the system bus (8) to the maintenance and service processor (6), wherein the bus transmitter circuits are activated for said transfers by a control signal on a control line (17*c*), and wherein the result data transfers and the internal shift steps are also overlapping.

8. A method for operating the device described in claim 3 in order to alternately transfer test and result data by applying the clock signals for the entry of the test data in the event of a latched second shift signal (SH-CL2) to the slave flip-flops (24) of the interface register stages through a separate control line (17*b*) connected to the maintenance and service processor (6) or a tester, whereas after such a test data entry, the result data are in each case transferred from the master flip-flops (23) of the interface register stages between two such test data entries, wherein said transfer is controlled by a control signal on control line (17*c*), also connected to the maintenance and service processor or tester, in that said signal activates the bus transmitter circuits (18), said test and result data transfers being made to internally overlap the shift operations in response to pulses of the first (SH-CL1) and the second shift clock (SH-CL2).

9. A method for operating the device described in claim 5 in order to obtain overlapped transfer of test and result data wherein the test data is transferred on a separate input bus (40), wherein said transfer is effected through separate receiver circuits (42) activated by a control signal on a further control line (17*d*), and wherein the test data in the master flip-flops (24) are + transferred in response to clock signals on a control line (17*b*), while the clock signals of the second shift clock (SH-CL2) are simultaneously latched and the result data from the preceding test step are transferred on the system bus (8), with the internal shift steps and the transfers overlapping one another.

* * * * *